(12) United States Patent
Ding et al.

(10) Patent No.: US 10,747,978 B2
(45) Date of Patent: Aug. 18, 2020

(54) ORGANIC LIGHT-EMITTING DISPLAY PANEL MANUFACTURING METHOD THEREOF AS WELL AS ELECTRONIC DEVICE

(71) Applicant: WUHAN TIANMA MICRO-ELECTRONICS CO., LTD., Wuhan (CN)

(72) Inventors: Hong Ding, Shanghai (CN); Kang Yang, Shanghai (CN); Lingxiao Du, Shanghai (CN); Yang Zeng, Shanghai (CN); Lihua Wang, Shanghai (CN); Qijun Yao, Shanghai (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 302 days.

(21) Appl. No.: 15/790,828

(22) Filed: Oct. 23, 2017

(65) Prior Publication Data
US 2018/0053032 A1 Feb. 22, 2018

(30) Foreign Application Priority Data
Jun. 9, 2017 (CN) .......................... 2017 1 0432778

(51) Int. Cl.
*G06K 9/00* (2006.01)
*H01L 27/32* (2006.01)
*H01L 27/146* (2006.01)

(52) U.S. Cl.
CPC ....... *G06K 9/00006* (2013.01); *G06K 9/0004* (2013.01); *H01L 27/3227* (2013.01); *H01L 27/3234* (2013.01); *H01L 27/14678* (2013.01)

(58) Field of Classification Search
CPC .............. G06K 9/00006; G06K 9/0004; H01L 27/14678; H01L 27/3227; H01L 27/3234;
(Continued)

(56) References Cited

U.S. PATENT DOCUMENTS

| 2008/0121442 A1* | 5/2008 | Boer ..................... G06F 3/0412 178/18.09 |
| 2009/0014718 A1* | 1/2009 | Hong ..................... H01L 22/14 257/48 |

(Continued)

FOREIGN PATENT DOCUMENTS

| CN | 106156753 A | 11/2016 |
| CN | 106157891 A | 11/2016 |

*Primary Examiner* — Kim Y Vu
*Assistant Examiner* — Michael J Vanchy, Jr.
(74) *Attorney, Agent, or Firm* — Alston & Bird LLP

(57) ABSTRACT

An organic light-emitting display panel and a manufacturing method thereof as well as an electronic device are provided. The organic light-emitting display panel includes: an array substrate; a photosensitive identification array including a plurality of photosensitive identification devices; and a photosensitive detection circuit including a common voltage input layer and a photosensitive detection switch. The photosensitive detection switch includes a drain metal layer, a first electrode of the photosensitive identification device is electrically connected with a drain metal layer of an associated photosensitive detection circuit and a second electrode thereof is electrically connected with the common voltage input layer of the associated photosensitive detection circuit. The common voltage input layer is overlapped with the first electrode of the associated photosensitive identification device or overlapped with the drain metal layer in the photosensitive detection circuit in a direction vertical to the array substrate, to form a photosensitive storage capacitor.

19 Claims, 12 Drawing Sheets

(58) Field of Classification Search
CPC ............. H01L 27/1225; H01L 27/1255; H01L 27/1259; H01L 27/1288; G02F 1/136213; G02F 1/13624; G02F 1/1368; G02F 2001/133397; G02F 2001/13606; G02F 2001/136236

See application file for complete search history.

(56) References Cited

U.S. PATENT DOCUMENTS

| | | | |
|---|---|---|---|
| 2016/0126381 A1* | 5/2016 | Wang | H01L 31/035227 257/429 |
| 2018/0211079 A1* | 7/2018 | Liu | G06F 3/041 |

* cited by examiner

ORGANIC LIGHT-EMITTING DISPLAY PANEL MANUFACTURING METHOD THEREOF AS WELL AS ELECTRONIC DEVICE

CROSS-REFERENCE TO RELATED APPLICATIONS

This application claims priority to a Chinese patent application No. CN201710432778.3 filed on Jun. 9, 2017, the disclosure of which is incorporated herein by reference in its entirety.

TECHNICAL FIELD

Embodiments of the present disclosure relate to a display technology, and particularly relate to an organic light-emitting display panel and a manufacturing method.

BACKGROUND

Fingerprints are inherent and unique for everyone. With the development of science and technology, a plurality of display apparatuses with a fingerprint identification function, such as a mobile phone, a tablet computer, an intelligent wearable device and the like, appear on the market. When a user operates a display apparatus with the fingerprint identification function, the user only needs to touch a fingerprint identification sensor of the display apparatus by a finger to perform fingerprint identification.

In an existing display apparatus with the fingerprint identification function, the fingerprint identification sensor is a single component. Moreover, the fingerprint identification sensor is often arranged on a front surface of the display apparatus, which occupies the area of a display screen. Occasionally, the fingerprint identification sensor may be arranged on a rear surface of the display apparatus, but most people are not comfortable to do so. Regardless whether the fingerprint identification sensor is arranged on the front surface or the rear surface, an opening should be formed in that surface of the display apparatus, this opening affects manufacturing cost and reliability of the apparatus.

SUMMARY

Embodiments of the present disclosure provide an organic light-emitting display panel and a manufacturing method thereof as well as an electronic device, to realize an embedded fingerprint identification function.

In a first aspect, embodiments of the present disclosure provide an organic light-emitting display panel, including: an array substrate; and a photosensitive identification array arranged on the array substrate.

The array substrate includes a plurality of photosensitive detection circuits. The photosensitive identification array includes a plurality of photosensitive identification devices, and each of the photosensitive detection circuits and an associated one of the photosensitive identification devices are electrically connected.

The plurality of photosensitive detection circuits each include a common voltage input layer and a photosensitive detection switch having a drain metal layer. Each of the plurality of photosensitive identification devices has a first pole and a second pole. The first pole is electrically connected with the drain metal layer of an associated photosensitive detection circuit, and the second pole is electrically connected with the common voltage input layer of the associated one of the photosensitive detection circuits.

The common voltage input layer of each of the photosensitive detection circuits and the first pole of the associated one of the photosensitive identification devices are overlapped with each other in a direction vertical to the array substrate to form a photosensitive storage capacitor. Or, the common voltage input layer and the drain metal layer in each of the photosensitive detection circuits are overlapped with each other in the direction vertical to the array substrate to form the photosensitive storage capacitor.

In a second aspect, embodiments of the present disclosure further provide a manufacturing method for an organic light-emitting display panel, including: providing an array substrate and forming a photosensitive identification array on the array substrate.

The array substrate includes a plurality of photosensitive detection circuits. Each of the photosensitive detection circuits includes a common voltage input layer and a photosensitive detection switch having a drain metal layer.

The photosensitive identification array includes a plurality of photosensitive identification devices. One of the plurality of photosensitive detection circuits and an associated one of the plurality of photosensitive identification devices are electrically connected. Each of the photosensitive identification devices includes a first pole and a second pole. The first pole of is electrically connected with the drain metal layer of the associated photosensitive detection circuit, and a second pole is electrically connected with the common voltage input layer of the associated photosensitive detection circuit.

The common voltage input layer of each of the photosensitive detection circuits and the first pole of the associated one of the photosensitive identification devices are overlapped with each other in a direction vertical to the array substrate to form a photosensitive storage capacitor, or, the common voltage input layer and the drain metal layer in each of the photosensitive detection circuits are overlapped with each other in the direction vertical to the array substrate to form the photosensitive storage capacitor.

In a third aspect, embodiments of the present disclosure further provide an electronic device, including the organic light-emitting display panel.

For the organic light-emitting display panel provided by embodiments of the present disclosure, a photosensitive detection circuit is arranged in an array substrate, and a photosensitive identification array is integrated on the array substrate, so the organic light-emitting display panel is a stacked structure of an organic light-emitting display array integrated with a fingerprint identification structure. Therefore, the organic light-emitting display panel provided by embodiments of the present disclosure has an integrated effect of organic light-emitting display and fingerprint identification, and also has an effect of embedded fingerprint identification, fingerprint touch control and full-screen fingerprint identification. Moreover, the area of the fingerprint identification structure in the organic light-emitting display panel is greatly increased, thereby effectively improving fingerprint identification precision. Compared with an existing art, the photosensitive identification array is integrated on the array substrate, without occupying the area of a display screen and forming a hole in encapsulating glass, thereby reducing the cost, improving the reliability of the panel and facilitating use of users. In addition, some films are multiplexed as a photosensitive storage capacitor by the organic light-emitting display panel, so the organic light-emitting display panel is an integrated stacked structure of reduced quantity of masks. Compared with the existing art, the photosensitive storage capacitor is not required to be separately arranged, thereby reducing the cost and manufacturing processes.

BRIEF DESCRIPTION OF DRAWINGS

To illustrate technical solutions in embodiments of the present disclosure more clearly, drawings to be used in the description of embodiments will be simply introduced below. Apparently, drawings described below are some embodiments of the present disclosure. Those ordinary skilled in the art can also obtain other drawings according to these drawings without contributing creative labor.

DETAILED DESCRIPTION

The present application will be further described below in detail in combination with the accompanying drawings and the embodiments. It should be appreciated that the specific embodiments described herein are merely used for explaining the relevant disclosure, rather than limiting the disclosure. In addition, it should be noted that, for the ease of description, only the parts related to the relevant disclosure are shown in the accompanying drawings.

Figure 1A:
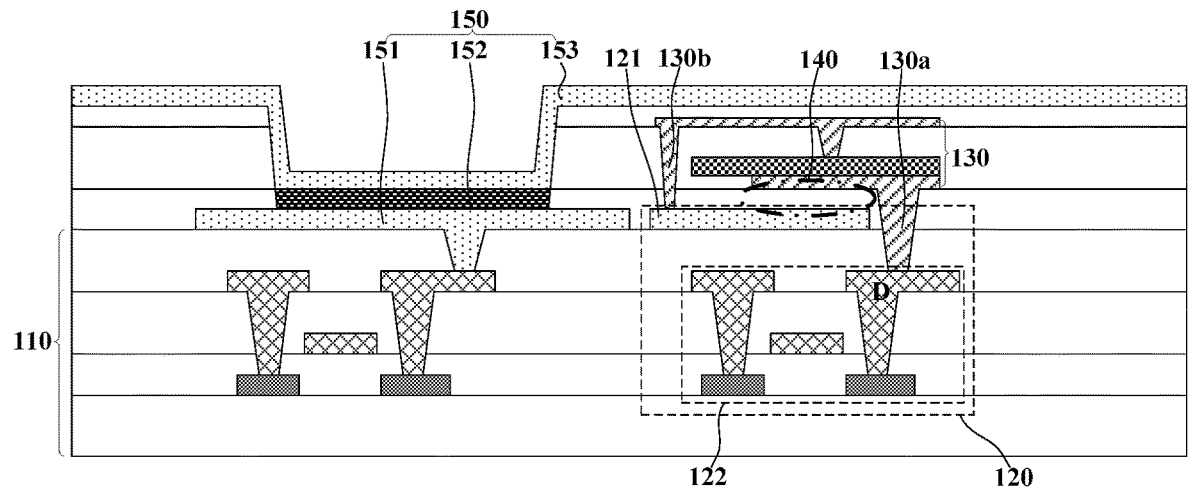
FIG. 1A~FIG. 1B are cross sectional diagrams illustrating two organic light-emitting display panels provided by embodiments of the present disclosure.

FIG. 1A is a schematic cross sectional diagram illustrating an organic light-emitting display panel provided by an embodiment of the present disclosure. The organic light-emitting display panel described in the embodiment of the present disclosure includes: an array substrate 110, and a photosensitive identification array located on the array substrate 110. The array substrate 110 includes a plurality of photosensitive detection circuits 120. The photosensitive identification array includes a plurality of photosensitive identification devices 130. The plurality of photosensitive detection circuits 120 and the plurality of photosensitive identification devices 130 are associated and electrically connected with each other. Each photosensitive detection circuit 120 includes a common voltage input layer 121 and a photosensitive detection switch 122 including a drain metal layer D. A first pole 130a of the photosensitive identification device 130 is electrically connected with the drain metal layer D of the associated photosensitive detection circuit 120, and a second pole 130b of the photosensitive identification device 130 is electrically connected with the common voltage input layer 121 of the associated photosensitive detection circuit 120. The common voltage input layer 121 of the photosensitive detection circuit 120 is overlapped with the first pole 130a of the associated photosensitive identification device 130 in a direction vertical to the array substrate 110 to form a photosensitive storage capacitor 140.

Preferably, referring to FIG. 1A, the organic light-emitting display panel further includes: a plurality of organic light-emitting configurations 150 disposed on the array substrate 110. Each organic light-emitting configuration 150 includes a first electrode 151, a light-emitting functional layer 152 and a second electrode 153 in a direction facing away from the array substrate 110 successively. Optionally, light rays emitted by the light-emitting functional layer 152 emit through the second electrode 153. In other alternative embodiments, optionally, the organic light-emitting display panel may be an organic light-emitting display panel in a bottom light-emitting mode or an organic light-emitting display panel in a double-faced light-emitting mode. The light-emitting mode of the organic light-emitting display panel is not specifically limited in the present disclosure.

It should be noted that, in the organic light-emitting display panel of embodiments of the present disclosure, the plurality of organic light-emitting configurations 150 optionally include organic light-emitting configurations of m colors, and the organic light-emitting configurations 150 of m different colors form an organic light-emitting unit. Optionally, the organic light-emitting unit and the photosensitive identification device 130 are arranged in a one-to-one correspondence manner. For example, referring to FIG. 2A~FIG. 2C, the organic light-emitting display panel includes a plurality of organic light-emitting units arranged in an array (herein, only 2*2 organic light-emitting units are shown, namely, the organic light-emitting units are arranged in an array of 2 rows and 2 columns, optionally, m=3), each of the organic light-emitting units and each of the photosensitive identification devices (marked as S) are associated. Each of the organic light-emitting units includes organic light-emitting configurations of three colors, i.e., a red organic light-emitting configuration R, a green organic light-emitting configuration G and a blue organic light-emitting configuration B respectively.

Figure 2A:
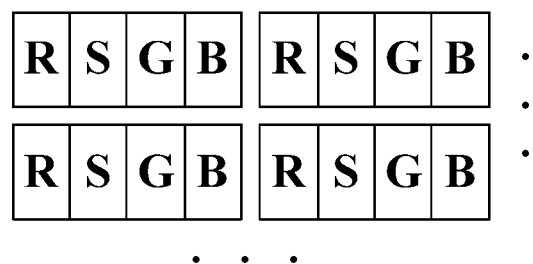
FIG. 2A~FIG. 2C are schematic diagrams illustrating three exemplary organic light-emitting display panels according to embodiments of the present disclosure.
Figure 2B:
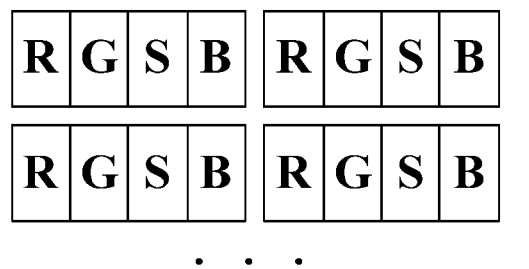
Figure 2C:
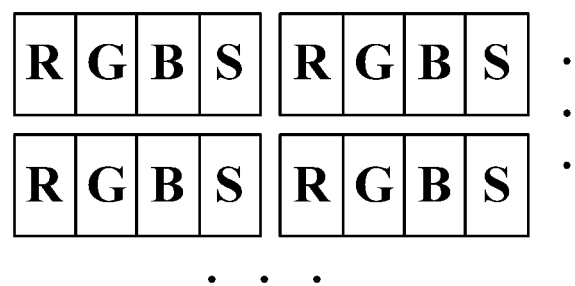

Specifically, referring to FIG. 2A, the photosensitive identification device S is adjacent to the red organic light-emitting configuration R in an associated organic light-emitting unit, and the photosensitive identification device S is arranged in a non-display region of the associated red organic light-emitting configuration R. Referring to FIG. 2B, the photosensitive identification device S is adjacent to the green organic light-emitting configuration G in an associated organic light-emitting unit, and the photosensitive identification device S is arranged in the non-display region of the associated green organic light-emitting configuration G. Referring to FIG. 2C, the photosensitive identification device S is adjacent to the blue organic light-emitting configuration B in an associated organic light-emitting unit, and the photosensitive identification device S is arranged in the non-display region of the associated blue organic light-emitting configuration B.

Optionally, the organic light-emitting display panel of embodiments of the present disclosure further includes a plurality of organic light-emitting configurations of the first color disposed on the array substrate. Each of the organic light-emitting configurations of the first color and each of the photosensitive identification devices are associated, and the photosensitive identification device is arranged in the non-display region of the associated organic light-emitting configuration of the first color. Specifically, referring to FIG. 2A~FIG. 2B, optionally, the organic light-emitting configuration of the first color is the red organic light-emitting configuration R and/or the green organic light-emitting configuration G. Herein, the photosensitive identification device S/130 is optionally distributed in the non-display region of the red organic light-emitting configuration R and/or the non-display region of the green organic light-emitting configuration G based on the reasons described below. A part of area of the organic light-emitting configuration 150 is occupied after the photosensitive identification device 130 and the photosensitive detection circuit 120 are stacked, thereby causing that a light-emitting region of the organic light-emitting configuration 150 is reduced and affecting the display brightness. Moreover, the light-emitting efficiency of the red organic light-emitting configuration R and the green organic light-emitting configuration G is higher than that of the blue organic light-emitting configuration B. Therefore, the light-emitting efficiency of the blue organic light-emitting configuration B is far lower than that of the red and the green organic light-emitting configurations if the light-emitting region of the blue organic light-emitting configuration B is occupied to arrange the photosensitive identification device 130, thereby substantially affecting a display effect of the organic light-emitting display panel. However, the influence on the display effect of the organic light-emitting display panel is relatively small if the light-emitting region of the red organic light-emitting configuration R and/or the green organic light-emitting configuration G is occupied to arrange the photosensitive identification device 130. Therefore, the photosensitive identification device S/130 is distributed in the non-display region of the red organic light-emitting configuration R and/or the non-display region of the green organic light-emitting configuration G.

Referring to FIG. 1A, in embodiments of the present disclosure, the first pole 130a of the photosensitive identification device 130 is generally a metal wire of the photosensitive identification device 130, and the second pole 130b of the photosensitive identification device 130 is another metal wire of the photosensitive identification device 130. Optionally, the first pole 130a of the photosensitive identification device 130 manufactured in embodiments of the present disclosure has a certain width. Thus, the common voltage input layer 121 of the photosensitive detection circuit 120 is overlapped with the first pole 130a of the associated photosensitive identification device 130 in a direction vertical to the array substrate 110 to form the photosensitive storage capacitor 140, thereby achieving the effect of reducing cost and the manufacturing processes of the photosensitive storage capacitor.

Figure 1B:
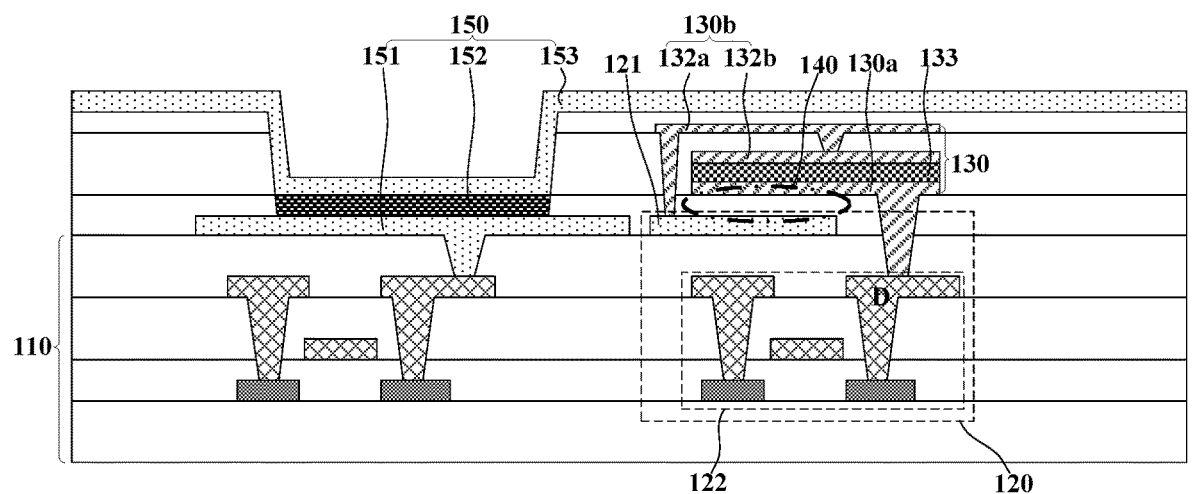

Optionally, referring to FIG. 1B, the first pole 130a of the photosensitive identification device 130 in the organic light-emitting display panel has a large area, so that an overlapping area of the first pole 130a of the photosensitive identification device 130 and the associated common voltage input layer 121 is increased while the first pole 130a of the associated photosensitive identification device 130 is electrically connected with the drain metal layer D of the photosensitive detection circuit 120. Therefore, the storage capacity of the photosensitive storage capacitor 140 is improved. On the other hand, the configurations other than the second pole 130b of the photosensitive identification device 130 may be formed with a mask. Compared with FIG. 1A, the quantity of masks is reduced, and the manufacturing is facilitated.

Optionally, referring to FIG. 1B, the second pole 130b of the photosensitive identification device 130 includes a first connection metal 132a and a second connection metal 132b. The first connection metal 132a is electrically connected with the second connection metal 132b and the common voltage input layer 121 of the associated photosensitive detection circuit 120 respectively. It should be noted that, a main configuration of the photosensitive identification device 130 is optionally a PN junction 133 having a photosensitive characteristic, and the second connection metal 132b is in direct contact with the PN junction 133. Then, before forming the first connection metal 132a of the second pole of 130b of the photosensitive identification device 130, a connection via hole for the first connection metal 132a and the second connection metal 132b is etched by taking the second connection metal 132b as a protective layer, so that the PN junction 133 is prevented from being damaged in a process of etching the connection via hole. Thus, the influence on performance of the photosensitive identification device 130 could be avoided. On the other hand, the first pole 130a, the PN junction 133 and the second connection metal 132b of the photosensitive identification device 130 shown in FIG. 1B are formed with a same mask. Compared with FIG. 1A, the quantity of masks is reduced, and the manufacturing is facilitated.

Referring to FIG. 1A and FIG. 1B, the array substrate 110 of the organic light-emitting display panel provided by embodiments of the present disclosure includes a plurality of photosensitive detection circuits 120, and a photosensitive identification array is further arranged on the array substrate 110. The photosensitive identification device 130 is configured to receive reflection light and convert the received reflection light into an electric signal. The light rays emitted from the organic light-emitting display panel are reflected through a touch body above the organic light-emitting display panel to form the reflection light. If the reflection light received by different photosensitive identification devices 130 has different intensity, the electric signals generated by these photosensitive identification devices 130 are different. The photosensitive detection circuit 120 electrically connected with the photosensitive identification device 130 reads the electric signals from the photosensitive identification device 130, and thus, the organic light-emitting display panel determines information about the touch body according to the electric signals from each photosensitive identification device 130. Optionally, in the case that the touch body is a finger of a user, the reflection light received by the photosensitive identification devices 130 is formed by reflecting the light rays emitted from the organic light-emitting display panel through the ridge of the finger, and the organic light-emitting display panel can determine fingerprint information of the ridge of the finger according to the electric signals from the photosensitive identification device 130.

On the other hand, the organic light-emitting display panel can determine location information of the finger according to the electric signals from the photosensitive identification devices 130 since the photosensitive identification device 130 generates electric signals according to the received reflection light and the photosensitive detection circuit 120 reads the electric signals from the photosensitive identification devices 130.

A photosensitive identification phase of the organic light-emitting display panel provided by embodiments of the present disclosure includes a data writing phase and a data reading phase. In the data writing phase, the common voltage input layer 121 transmits a common voltage signal to the second pole 130*b* of an associated photosensitive identification device 130, and the photosensitive detection switch 122 is turned on to transmit a photosensitive data signal to the first pole 130*a* of the associated photosensitive identification device 130 through the drain metal layer D, so the photosensitive storage capacitor 140 formed between the common voltage input layer 121 and the first pole 130*a* of the associated photosensitive identification device 130 holds a first potential. If the organic light-emitting display panel is touched by the finger, the photosensitive identification device 130 generates an associated current change according to the intensity of the received reflection light, and the photosensitive storage capacitor 140 is changed to hold a second potential. In the data reading phase, the organic light-emitting display panel reads potential information held by the photosensitive storage capacitor 140 through the photosensitive detection switch 122, and determines the fingerprint information and/or location information of the finger according to the potential information.

As can be seen, for the organic light-emitting display panel provided by embodiments of the present disclosure, the photosensitive detection circuit 120 is provided in the array substrate 110, and the photosensitive identification array is integrated on the array substrate 110. That is to say, the organic light-emitting display panel is a stacked structure of an organic light-emitting display array integrated with fingerprint identification configurations. Through the organic light-emitting display panel, both of organic light-emitting display and fingerprint identification are realized, and an effect of embedded fingerprint identification, fingerprint touch control and full-screen fingerprint identification are also realized. Moreover, the area of the fingerprint identification configuration in the organic light-emitting display panel is greatly increased, thereby effectively improving the fingerprint identification precision. Compared with the existing art, the photosensitive identification array is integrated on the array substrate 110 so that it is not required to occupy the area of a display screen and form an opening in the encapsulating glass. Therefore, the cost is reduced, the reliability of the panel is improved and use of the user is facilitated.

Some films are multiplexed as the photosensitive storage capacitor 140 in the organic light-emitting display panel provided by embodiments of the present disclosure. Specifically, the first pole 130*a* of the photosensitive identification device 130 is multiplexed as one electrode of the photosensitive storage capacitor 140, and the common voltage input layer 121 is multiplexed as the other electrode of the photosensitive storage capacitor 140. Thus, the organic light-emitting display panel is an integrated stacked structure of reduced quantity of masks. Compared with the existing art, the photosensitive storage capacitor 140 does not need to be separately arranged, thereby achieving the effects of reducing the cost and the manufacturing processes.

Figure 3:
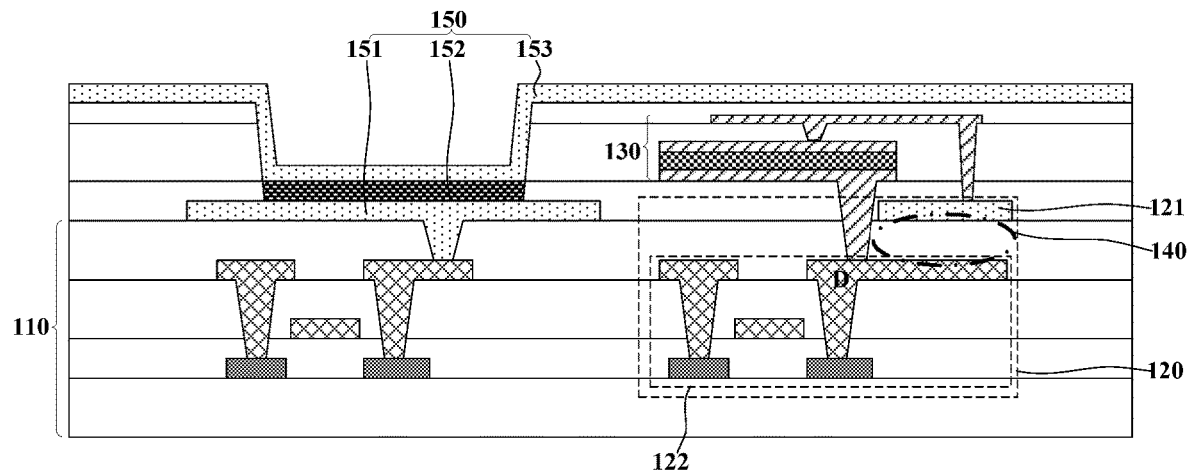
FIG. 3~FIG. 12 are cross sectional diagrams of exemplary organic light-emitting display panels according to embodiments of the present disclosure.

Optionally, referring to FIG. 3, the organic light-emitting display panel shown in FIG. 3 is different from that shown in FIG. 1A and FIG. 1B is that, the common voltage input layer 121 of the photosensitive detection circuit 120 in the organic light-emitting display panel is overlapped with the drain metal layer D in the direction vertical to the array substrate 110 to form the photosensitive storage capacitor 140. Some films are multiplexed as the photosensitive storage capacitor 140 in the organic light-emitting display panel shown in FIG. 3. Specifically, the drain metal layer D of the photosensitive detection switch 122 is multiplexed as one electrode of the photosensitive storage capacitor 140, and the common voltage input layer 121 is multiplexed as the other electrode of the photosensitive storage capacitor 140. Thus, the organic light-emitting display panel is an integrated stacked structure of reduced quantity of masks. Compared with the existing art, it is not required to separately provide the photosensitive storage capacitor 140, thereby reducing the cost and the manufacturing processes.

Optionally, referring to the organic light-emitting display panel shown in FIG. 1A~FIG. 3, the common voltage input layer 121 of the photosensitive detection circuit 120 and the first electrode 151 of the organic light-emitting configuration 150 are in the same layer. In the present embodiment, the common voltage input layer 121 and the first electrode 151 of the organic light-emitting configuration 150 are formed by one mask simultaneously, and have the same material. Therefore, not only one mask process is omitted, but also an insulating layer and a metal layer are reduced, and further reducing the cost, the manufacturing process and the thickness of the organic light-emitting display panel.

Figure 4:
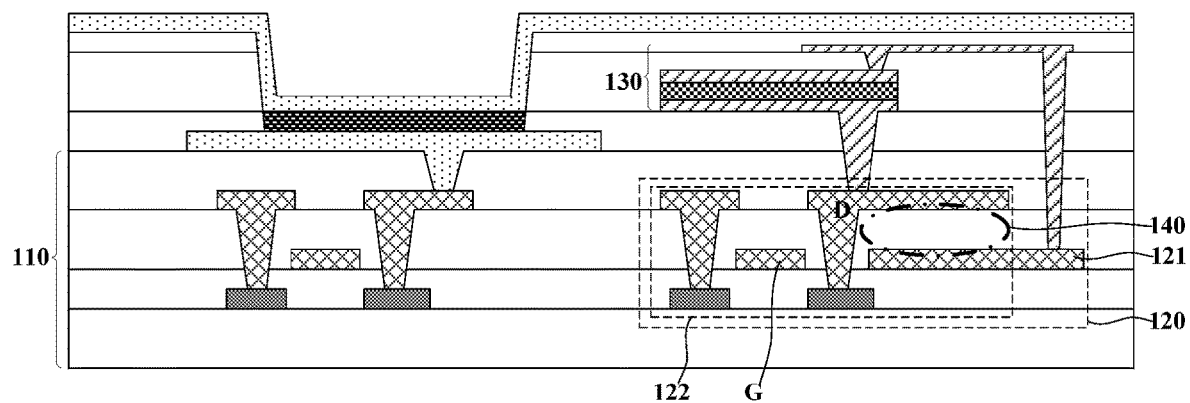

Optionally, referring to the organic light-emitting display panel shown in FIG. 4, the photosensitive detection switch 122 further includes a first gate G In the photosensitive identification phase, a drive signal is applied to the first gate G of the photosensitive detection switch 122 to drive the photosensitive detection switch 122 to be turned on, so that a photosensitive data signal is transmitted to the associated photosensitive identification device 130 through the drain metal layer D, and the potential information of the photosensitive storage capacitor 140 in the photosensitive identification device 130 is read through the drain metal layer D to determine information regarding the touch body.

Optionally, referring to FIG. 4, the organic light-emitting display panel shown in FIG. 4 is different from that shown in FIG. 1A~FIG. 3 in that, the common voltage input layer 121 of the photosensitive detection circuit 120 and the first gate G of the photosensitive detection switch 122 are in the same layer. The common voltage input layer 121 and the drain metal layer D in the photosensitive detection circuit 120 are overlapped with each other in a direction vertical to the array substrate 110 to form the photosensitive storage capacitor 140. In the present embodiment, the common voltage input layer 121 and the first gate G of the photosensitive detection switch 122 are formed with one mask simultaneously and have the same material. Since the common voltage input layer 121 is served as one pole of the photosensitive storage capacitor 140, not only one mask process is omitted, but also an insulating layer and a metal layer are omitted. Therefore, the cost is further reduced, the manufacturing process is further reduced and the thickness of the organic light-emitting display panel is reduced.

Figure 5:
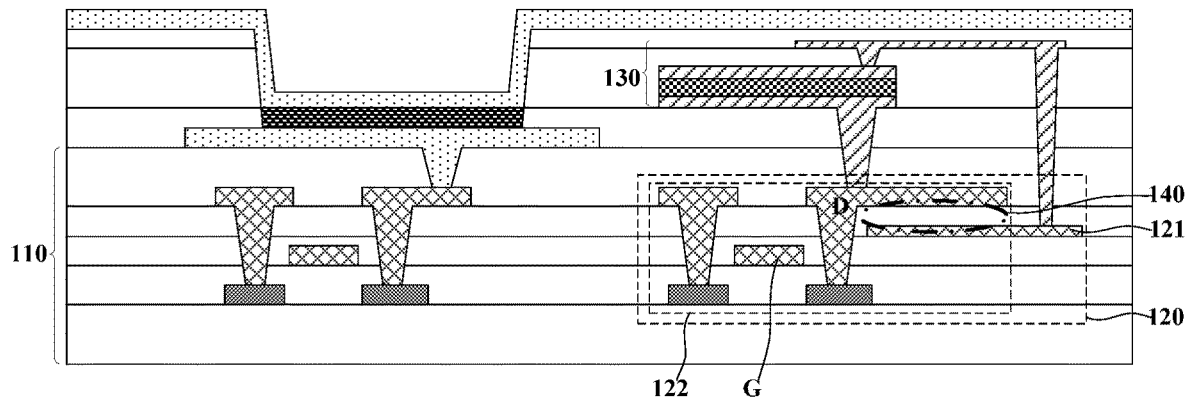

Optionally, referring to the organic light-emitting display panel shown in FIG. 5, the photosensitive detection switch 122 further includes a first gate G. Different from the organic light-emitting display panel shown in FIG. 1A~FIG. 4, the common voltage input layer 121 of the photosensitive detection circuit 120 in the organic light-emitting display panel shown in FIG. 5 is arranged between a film in which the first gate G of the photosensitive detection switch 122 is located and a film in which the drain metal layer D of the photosensitive detection switch 122 is located. The common voltage input layer 121 and the drain metal layer D in the photosensitive detection circuit 120 are overlapped with each other in the direction vertical to the array substrate 110 to form the photosensitive storage capacitor 140. In the present embodiment, the common voltage input layer 121 is multiplexed as one pole of the photosensitive storage capacitor 140, and the drain metal layer D is multiplexed as the other pole of the photosensitive storage capacitor 140. Therefore, it is not required to manufacture the photosensitive storage capacitor separately. Accordingly, the manufacturing cost and the manufacturing process of the organic light-emitting display panel are reduced, and the thickness of the organic light-emitting display panel is reduced.

Figure 6:
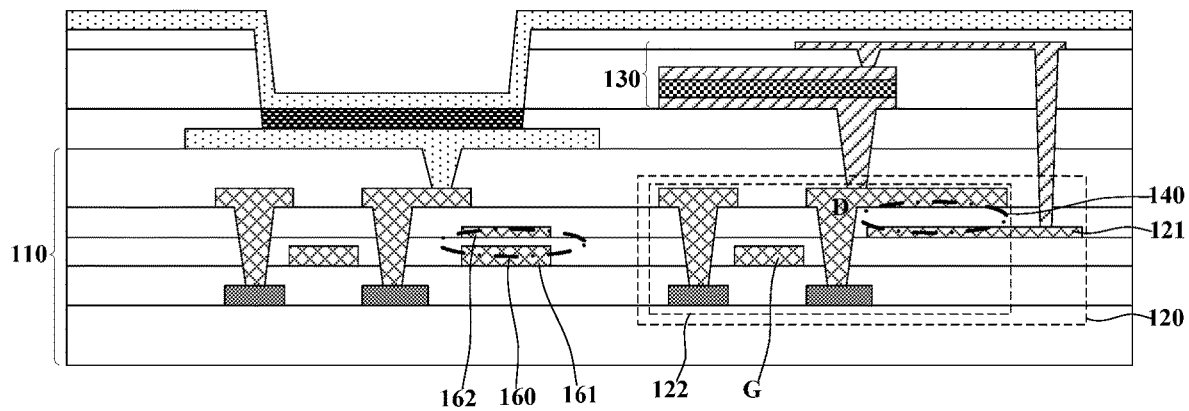

Optionally, referring to the organic light-emitting display panel shown in FIG. 6, different from the organic light-emitting display panel shown in FIG. 1A~FIG. 5, the array substrate 110 further includes a pixel storage capacitor 160. A first pole 161 of the pixel storage capacitor 160 and the first gate G of the photosensitive detection switch 122 are in the same layer, and a second pole 162 of the pixel storage capacitor 160 and the common voltage input layer 121 are in the same layer. The common voltage input layer 121 and the drain metal layer D in the photosensitive detection circuit 120 are overlapped with each other in the direction vertical to the array substrate 110 to form the photosensitive storage capacitor 140. In the present embodiment, the common voltage input layer 121 and the second pole 162 of the pixel storage capacitor 160 are formed with one mask simultaneously and have the same material. Therefore, not only one mask process is omitted, but also an insulating layer and a metal layer are omitted. Accordingly, the cost, the manufacturing process and the thickness of the organic light-emitting display panel are further reduced.

Figure 7:
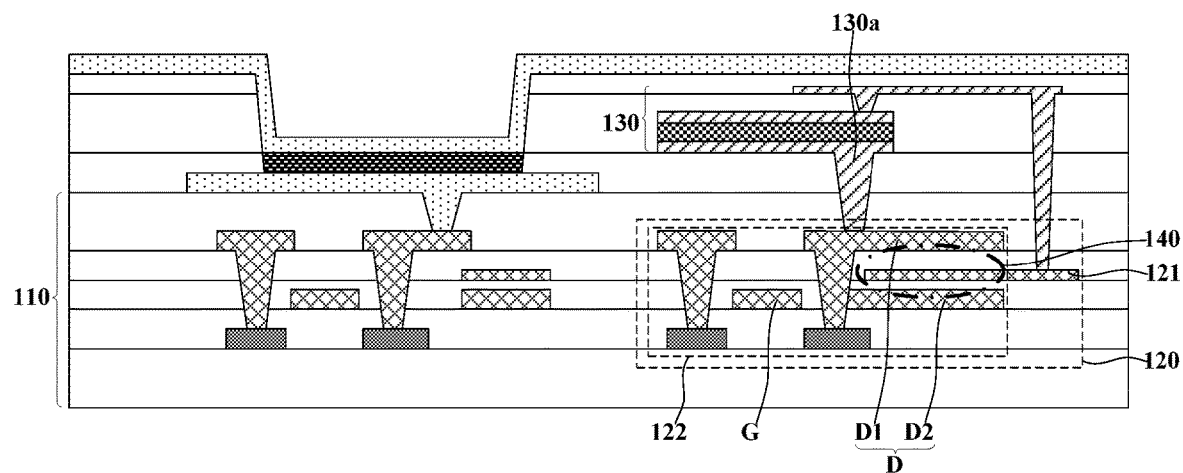

Optionally, referring to the organic light-emitting display panel shown in FIG. 7, different from the organic light-emitting display panel shown in FIG. 1A~FIG. 6, the drain metal layer D of the photosensitive detection switch 122 includes a first drain D1 and a compensation drain layer D2 electrically connected with the first drain D1. The compensation drain layer D2 and the first drain D1 are in different layers. The first pole 130a of the photosensitive identification device 130 is electrically connected with the first drain D1 of the associated photosensitive detection circuit 120. In the photosensitive detection circuit 120, the common voltage input layer 121 is arranged between a film in which the first drain D1 is located and the compensation drain layer D2, and the common voltage input layer 121 is overlapped with the first drain D1 and the compensation drain layer D2 in the direction vertical to the array substrate 110 respectively. A photosensitive storage capacitor 140 is formed by the common voltage input layer 121 and the associated first drain D1 in the photosensitive detection circuit 120, and meanwhile, a photosensitive storage capacitor 140 is formed by the common voltage input layer 121 and the associated compensation drain layer D2.

In the present embodiment, it is not required to manufacture the photosensitive storage capacitor separately. Accordingly, the manufacturing cost and the manufacturing process of the organic light-emitting display panel are reduced, and the thickness of organic light-emitting display panel is reduced. Moreover, since the common voltage input layer 121 is arranged between a film in which the first drain D1 is located and a film in which the compensation drain layer D2 is located, the area of the photosensitive storage capacitor 140 is effectively increased. Therefore, the photosensitive identification performance and the fingerprint identification precision are further improved.

Optionally, referring to the organic light-emitting display panel shown in FIG. 7, the compensation drain layer D2 and the first gate G of the photosensitive detection switch 122 may be in the same layer. In the present embodiment, the first gate G and the compensation drain layer D2 are formed with one mask simultaneously and have the same material. Therefore, not only one mask process is omitted, but also an insulating layer and a metal layer are omitted. Thus, the cost, the manufacturing process and the thickness of the organic light-emitting display panel are further reduced. Moreover, the area of the photosensitive storage capacitor 140 is effectively increased, and the photosensitive identification performance and the fingerprint identification precision are further improved.

Figure 8:
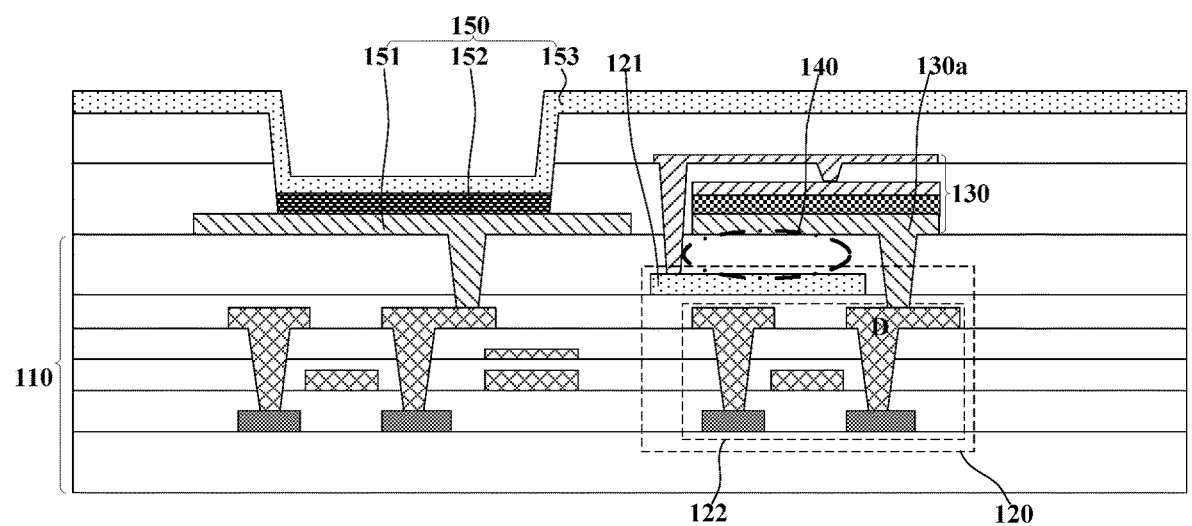

Optionally, referring to the organic light-emitting display panel shown in FIG. 8, the photosensitive storage capacitor 140 is formed between the common voltage input layer 121 in the photosensitive detection circuit 120 and the first pole 130a of the associated photosensitive identification device 130. In the present embodiment, it is not required to manufacture the photosensitive storage capacitance separately. Accordingly, the manufacturing cost and the manufacturing process of the organic light-emitting display panel are reduced, and the thickness of the organic light-emitting display panel is reduced.

Optionally, referring to the organic light-emitting display panel shown in FIG. 8, different from the organic light-emitting display panel shown in FIG. 1A~FIG. 7, the first pole 130a of the photosensitive identification device 130 and the first electrode 151 of the organic light-emitting configuration 150 are in the same layer. In the present embodiment, the first electrode 151 and the first pole 130a of the photosensitive identification device 130 are formed with one mask simultaneously and have the same material. Thus, not only one mask process is omitted, but also an insulating layer and a metal layer are omitted. Therefore, the cost, the manufacturing process and the thickness of the organic light-emitting display panel are further reduced.

Figure 9:
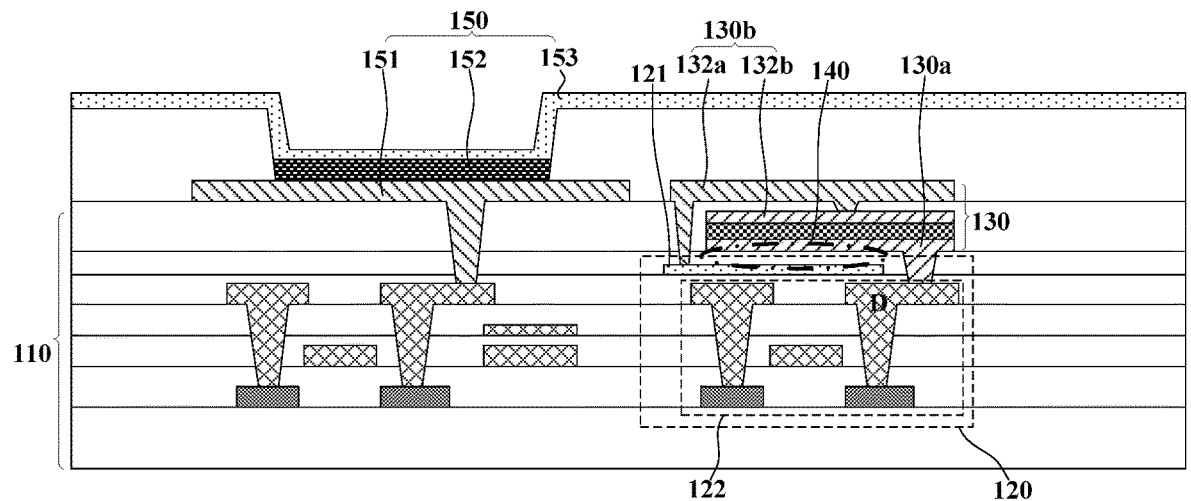

Optionally, referring to the organic light-emitting display panel shown in FIG. 9, the second pole 130b of the photosensitive identification device 130 includes a first connection metal 132a and a second connection metal 132b. The first connection metal 132a is electrically connected with the second connection metal 132b and the common voltage input layer 121 of the associated photosensitive detection circuit 120 respectively. Optionally, the photosensitive storage capacitor 140 is formed between the common voltage input layer 121 in the photosensitive detection circuit 120 and the first pole 130a of the associated photosensitive identification device 130. In the present embodiment, it is not required to manufacture the photosensitive storage capacitor separately. Accordingly, the manufacturing cost and the manufacturing process of the organic light-emitting display panel are reduced, and the thickness of the organic light-emitting display panel is reduced.

Optionally, referring to the organic light-emitting display panel shown in FIG. 9, different from the organic light-emitting display panel shown in FIG. 1A~FIG. 8, the first connection metal 132a and the first electrode 151 of the organic light-emitting configuration 150 are in the same layer. In the present embodiment, the first electrode 151 and the first connection metal 132a are formed with one mask in the same layer simultaneously and have the same material. Thus, not only one mask process is omitted, but also an insulating layer and a metal layer are omitted. Therefore, the cost, the manufacturing process and the thickness of the organic light-emitting display panel are further reduced.

Figure 10:
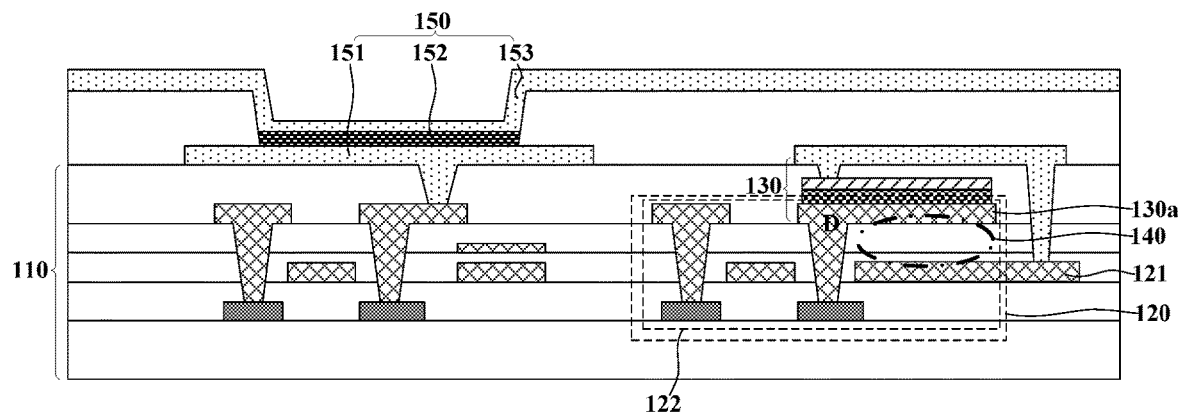

Optionally, referring to the organic light-emitting display panel shown in FIG. 10, different from the organic light-emitting display panel shown in FIG. 1A~FIG. 9, the drain metal layer D of the photosensitive detection switch 122 is multiplexed as the first pole 130a of the photosensitive identification device 130. Optionally, the photosensitive storage capacitor 140 is formed between the common voltage input layer 121 in the photosensitive detection circuit 120 and the drain metal layer D of the associated photosensitive detection switch 122. The first electrode 151 of the organic light-emitting display panel generally has an ITO-Ag-ITO structure. On the other hand, there exists lots of wet and dry etching processes in the manufacturing procedure of the photosensitive identification device 130, thereby possibly affecting a work function and a surface condition of the first electrode 151 of the organic light-emitting display panel, and further affecting the light-emitting efficiency of the organic light-emitting display panel.

In the present embodiment, the drain metal layer D of the photosensitive detection switch 122 is multiplexed as the first pole 130a of the photosensitive identification device 130, that is, the photosensitive identification device 130 is manufactured by directly taking the drain metal layer D as the first pole 130a of the photosensitive identification device 130. Thus, the first electrode 151 of the organic light-emitting display panel is formed after the photosensitive identification device 130 is subjected to multiple wet and dry etching processes in the manufacturing process. Therefore, multiple wet and dry etching processes subjected by the photosensitive identification device 130 neither affect the work function and the surface condition of the first electrode 151 of the organic light-emitting display panel nor affect the light-emitting efficiency of the organic light-emitting display panel. In the present embodiment, the masks adopted by the photosensitive identification device 130 are reduced, and it is not required to manufacture the photosensitive storage capacitor separately. Accordingly, the manufacturing cost and the manufacturing process of the organic light-emitting display panel are reduced, and the thickness of organic light-emitting display panel is reduced.

Figure 11:
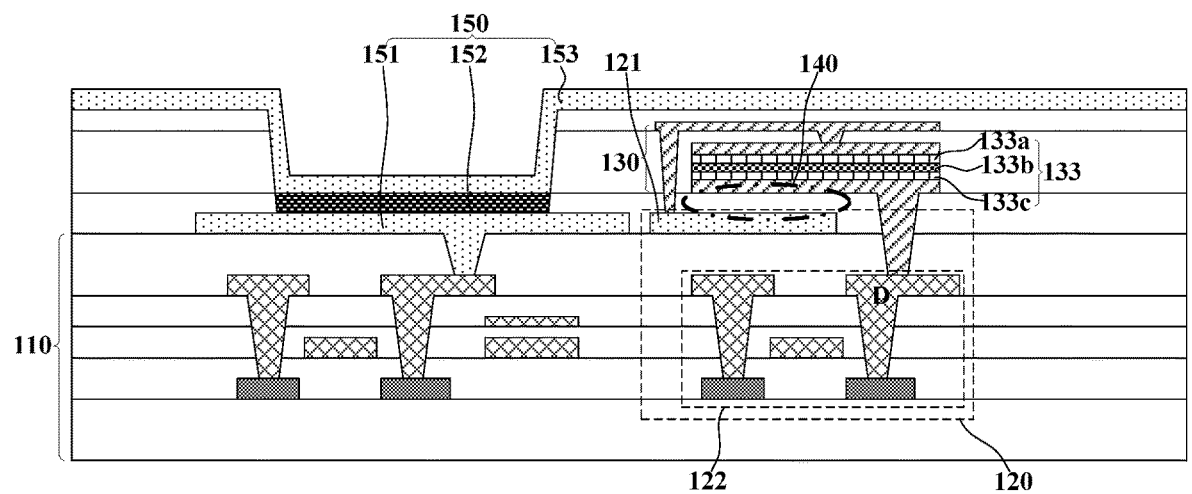

Optionally, based on the above FIG. 1A~FIG. 10, referring to the organic light-emitting display panel shown in FIG. 11, the photosensitive identification device 130 includes a PN junction 133 with a photosensitive characteristic. The PN junction 133 includes a P-doped semiconductor layer 133a, an amorphous silicon layer 133b and an N-doped semiconductor layer 133c which are stacked successively. The P-doped semiconductor layer 133a is electrically connected with the common voltage input layer 121 of the associated photosensitive detection circuit 120, and the N-doped semiconductor layer 133c is electrically connected with the drain metal layer D of the associated photosensitive detection circuit 120.

The photosensitive detection switch 122 further includes a source electrically connected with a photosensitive data line (not shown). The photosensitive data line is configured to transmit a photosensitive data signal to the photosensitive identification device 130, and read the potential information of the photosensitive storage capacitor 140 of the photosensitive identification device 130 after lighting. The photosensitive identification device 130 is generally in a biased state. In the case that the P-doped semiconductor layer 133a of the PN junction 133 is electrically connected with the common voltage input layer 121 and the N-doped semiconductor layer 133c is electrically connected with the drain metal layer D, optionally, the potential of the common voltage input layer 121 is −5V, and the potential of the written photosensitive data signal of the photosensitive data line is 1.8V.

Figure 12:
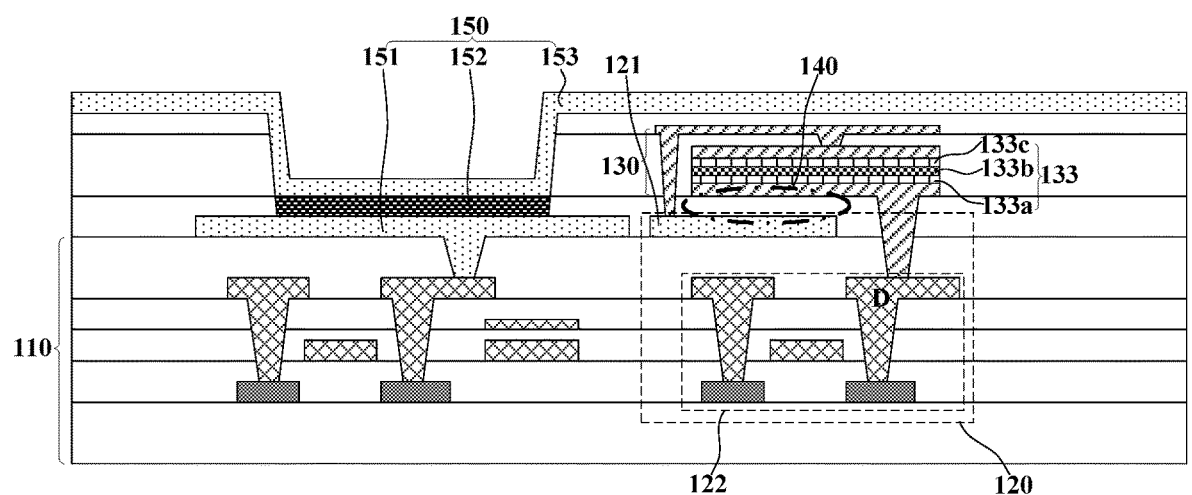

Optionally, referring to the organic light-emitting display panel shown in FIG. 12, different from the organic light-emitting display panel shown in FIG. 11, the P-doped semiconductor layer 133a is electrically connected with the drain metal layer D of the associated photosensitive detection circuit 120, and the N-doped semiconductor layer 133c is electrically connected with the common voltage input layer 121 of the associated photosensitive detection circuit 120. In this case, to guarantee that the photosensitive identification device 130 is in the biased state to normally work, optionally, the potential of the common voltage input layer 121 is 5V, and the potential of the written photosensitive data signal of the photosensitive data line is −1.8V.

It should be noted that, FIG. 1A~FIG. 12 only illustrate part of structures of the organic light-emitting display panel, rather than all structures. As for other structures of the organic light-emitting display panel, the existing organic light-emitting display panel can be referred to, and no more detailed description is provided herein. Those skilled in the art can understand that, an arrangement mode of the photosensitive identification devices and the photosensitive detection circuits in the organic light-emitting display panel includes, but not limited to, the above examples. On the premise of not affecting a display function of the organic light-emitting display panel, the arrangement mode of the plurality of photosensitive identification devices and photosensitive detection circuits can be combined and recombined to each other, and no more detailed description is provided herein. Those skilled in the art can also understand that, the organic light-emitting display panel provided by embodiments of the present disclosure includes, but not limited to, the following examples.

Figure 13A:
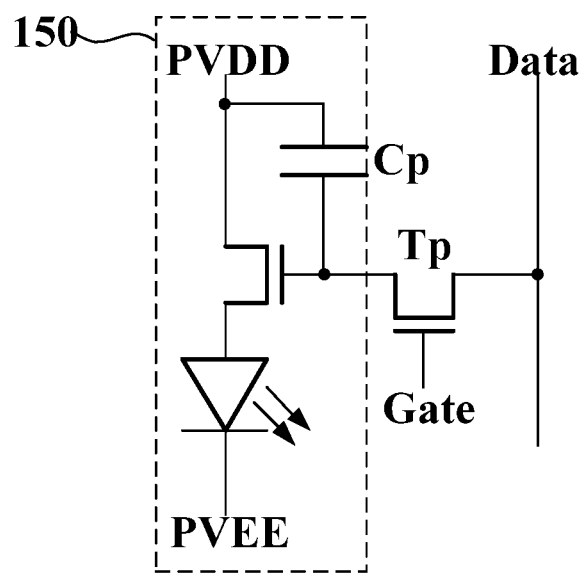
FIG. 13A is a schematic diagram illustrating an equivalent driving circuit of a pixel of an organic light-emitting display panel according to an embodiment of the present disclosure.

Optionally, FIG. 13A is an equivalent driving circuit of a pixel in any organic light-emitting display panel described above. The pixel includes an organic light-emitting configuration 150 and a pixel switch Tp electrically connected with the organic light-emitting configuration 150. The source of the pixel switch Tp is electrically connected with a data line Data, the gate of the pixel switch Tp is electrically connected with a scanning line Gate, and the drain of the pixel switch Tp is electrically connected with the organic light-emitting configuration 150. The organic light-emitting configuration 150 includes a first electrode, a light-emitting functional layer and a second electrode. PVDD and PVEE voltage signals are applied to the first electrode and the second electrode respectively, so that the organic light-emitting configuration 150 emits light rays. The light rays emitted from the organic light-emitting configuration 150 may be taken as a light source of the photosensitive identification device.

Figure 13B:
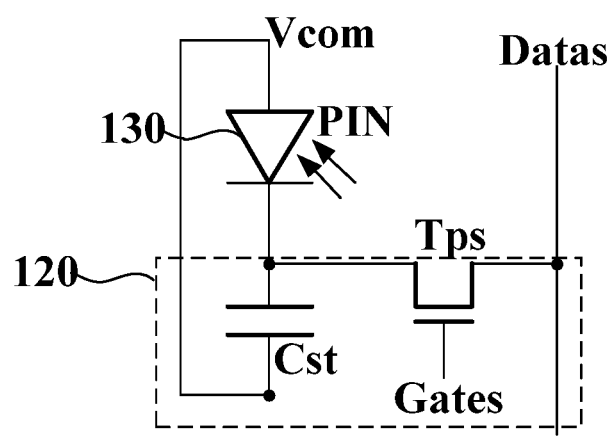
FIG. 13B is a schematic diagram illustrating a photosensitive equivalent circuit of an organic light-emitting display panel according to an embodiment of the present disclosure.

Optionally, FIG. 13B is a photosensitive equivalent circuit in any organic light-emitting display panel described above. The photosensitive equivalent circuit includes a photosensitive identification device 130 and a photosensitive detection circuit 120 electrically connected with the photosensitive identification device 130. Optionally, the source of a photosensitive detection switch Tps of the photosensitive detection circuit 120 is electrically connected with the photosensitive data line Datas. The gate of the photosensitive detection switch Tps is electrically connected with a photosensitive scanning line Gates. The drain metal layer of the photosensitive detection switch Tps is electrically connected with the photosensitive identification device 130, and is served as one pole of a photosensitive storage capacitor Cst. The photosensitive identification device 130 includes a PIN junction with a photosensitive characteristic. Optionally, a positive electrode of the PIN junction is electrically connected with a common voltage input layer Vcom, a negative electrode of the PIN junction is electrically connected with the drain metal layer of the photosensitive detection switch Tps. The photosensitive storage capacitor Cst is formed between the common voltage input layer Vcom and the drain metal layer of the photosensitive detection switch Tps. A photosensitive identification phase includes a data writing phase. At this time, the photosensitive detection switch Tps is turned on, and the common voltage signal of the common voltage input layer Vcom and a photosensitive data signal in the photosensitive data line Datas are written into the photosensitive storage capacitor Cst. As a result, a constant voltage difference is formed across the photosensitive storage capacitor Cst. The photosensitive identification phase further includes a data reading phase. The photosensitive identification device 130 generates a corresponding current change according to the intensity of the received reflection light when the organic light-emitting display panel is touched by the finger, so as to obtain a potential of the photosensitive storage capacitor Cst. In the data reading phase, the photosensitive detection switch Tps is turned on, and the organic light-emitting display panel reads the potential information of the photosensitive storage capacitor Cst through the photosensitive data line Datas. Thus, the organic light-emitting display panel can determine the fingerprint information and/or location information of the finger according to the written potential information and read potential information of the photosensitive storage capacitance Cst.

Figure 14:
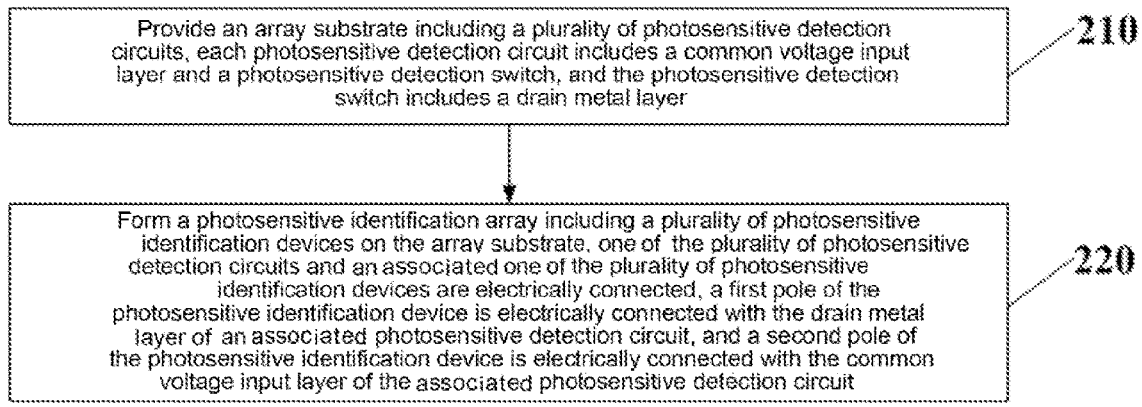
FIG. 14 is a flow chart illustrating a method for manufacturing an organic light-emitting display panel according to an embodiment of the present disclosure.

Optionally, FIG. 14 shows a method for manufacturing an organic light-emitting display panel provided by embodiments of the present disclosure, including:

step 210, providing an array substrate including a plurality of photosensitive detection circuits, each photosensitive detection circuit including a common voltage input layer and a photosensitive detection switch, and the photosensitive detection switch having a drain metal layer; and step 220, forming a photosensitive identification array including a plurality of photosensitive identification devices on the array substrate, and one of the plurality of photosensitive detection circuits being associated with and electrically connected with one of the plurality of photosensitive identification devices, a first pole of each photosensitive identification device being electrically connected with the drain metal layer of an associated photosensitive detection circuit, and a second pole of each photosensitive identification device being electrically connected with the common voltage input layer of the associated photosensitive detection circuit.

The common voltage input layer of each photosensitive detection circuit and the first pole of the associated photosensitive identification device are overlapped with each other in a direction vertical to the array substrate to form a photosensitive storage capacitor. Alternatively, the common voltage input layer and the drain metal layer of each photosensitive detection circuit are overlapped with each other in the direction vertical to the array substrate to form a photosensitive storage capacitor.

The structure of the organic light-emitting display panel provided by embodiments of the present disclosure is different from a structure in the exiting art, but the films are prepared by multiple process methods which are not specifically limited and described herein. The organic light-emitting display panel provided by embodiments of the present disclosure can be prepared with the existing preparation process method, for example, films of a photosensitive detection switch and a pixel switch can be formed with wet and dry etching processes and other processes.

The structure of the organic light-emitting display panel formed by the above manufacture method is a stacked structure of an organic light-emitting display array integrated with a fingerprint identification structure, through which an integrated effect of organic light-emitting display and fingerprint identification is realized, and an effect of embedded fingerprint identification, fingerprint touch control and full-screen fingerprint identification are also realized. Moreover, the area of the fingerprint identification structure in the organic light-emitting display panel is greatly increased, thereby effectively improving fingerprint identification precision. Compared with the existing art, the photosensitive identification array is integrated on the array substrate, without occupying the area of a display screen and forming a hole in encapsulating glass, thereby reducing the cost, improving the reliability of the panel and facilitating use of the user. Some films are multiplexed as a photosensitive storage capacitor, so the organic light-emitting display panel is an integrated stacked structure of reduced quantity of masks. Compared with the existing art, it is not required to provide the photosensitive storage capacitor separately, thereby reducing the cost and the manufacturing process.

Figure 15:
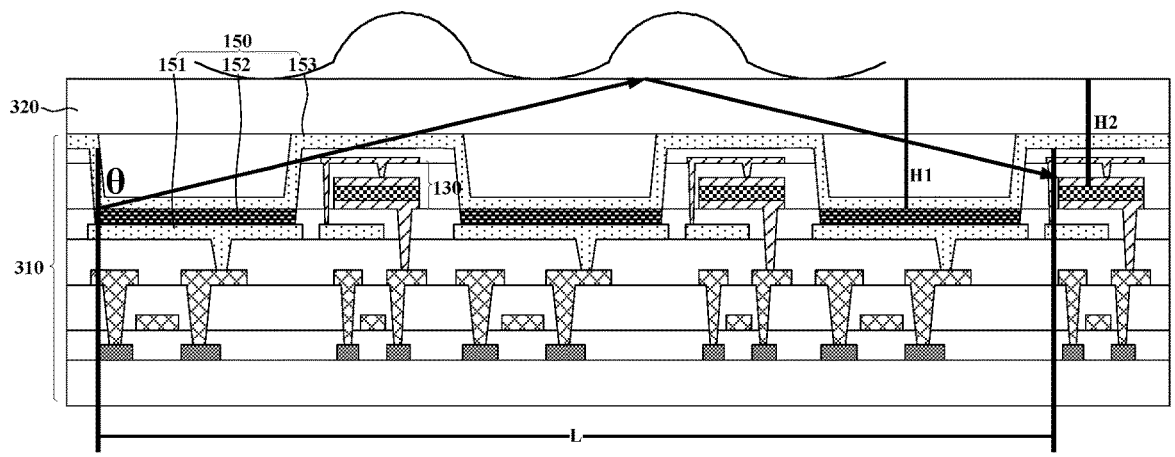
FIG. 15 is a schematic diagram illustrating a cross section of an organic light-emitting display apparatus provided by embodiments of the present disclosure.

Optionally, embodiments of the present disclosure further provide a fingerprint identification method of an organic light-emitting display apparatus. Referring to FIG. 15, the organic light-emitting display apparatus includes: any organic light-emitting display panel 310 stated above and a cover plate 320 disposed on the organic light-emitting display panel 310. Light emerges from a first surface facing away from the organic light-emitting display panel 310 of the cover plate 320.

Figure 16:
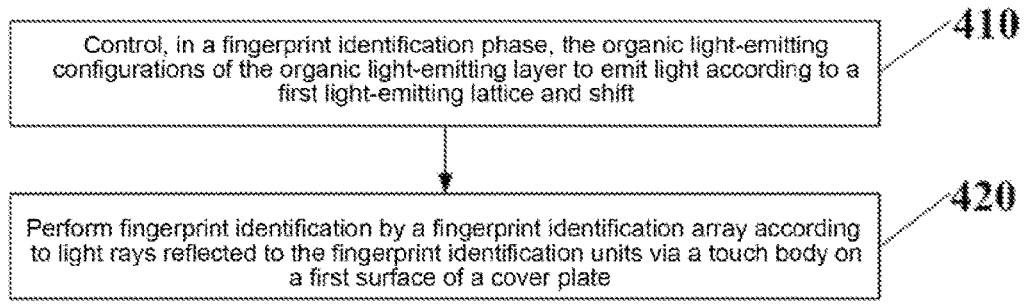
FIG. 16 is a flow chart illustrating a fingerprint identification method of an organic light-emitting display apparatus according to an embodiment of the present disclosure.

Referring to FIG. 16, the fingerprint identification method of the organic light-emitting display apparatus shown in FIG. 15 includes steps described below.

In step 410, in a fingerprint identification phase, each organic light emitting configuration is controlled to emit light according to the first light emitting lattice and shift, where the distance between any two adjacent organic light emitting configurations in the first light emitting lattice is greater than or equal to a minimum crosstalk-free distance. The minimum crosstalk-free distance is a maximum radius of a covering region formed on the photosensitive identification array by the light emitted from any organic light emitting configuration and reflected through the first surface of the cover plate.

In step 420, the fingerprint identification is performed by the photosensitive identification array according to the light ray reflected on each of the photosensitive identification devices by a touch body on the first surface of the cover plate. Optionally, the touch body in the present embodiment is the user's finger.

The fingerprint identification method is performed by the organic light-emitting display apparatus provided by embodiments of the present disclosure in a manner of screen scanning. Each of the organic light emitting configurations in one screen emits light according to the first light emitting lattice and shifts. Since the distance between any two adjacent organic light emitting configurations in the first light emitting lattice is greater than or equal to the minimum crosstalk-free distance, the fingerprint reflection light formed by reflecting the light ray emitted from any organic light emitting configuration in the first light emitting lattice with the fingerprint of the finger of the user will not irradiate the photosensitive identification devices associated with other organic light emitting configurations in the lattice. Therefore, the photosensitive identification device associated with each organic light-emitting configuration in the first light emitting lattice can only receive the fingerprint reflection light formed by the light ray emitted from the organic light emitting configuration associated with the photosensitive identification device in the first light emitting lattice. Namely, the photosensitive identification device will not receive crosstalk signals from other organic light emitting configurations. Accordingly, the inductive signals generated by the photosensitive identification device accurately indicates the reflection of the light ray emitted from the associated organic light emitting configuration on the fingerprint of the user's finger. Therefore, the display apparatus provided by the present embodiment improves the fingerprint identification precision.

Referring to FIG. 15 and FIG. 16, in the fingerprint identification phase, the organic light-emitting display apparatus provided by embodiments of the present disclosure performs the fingerprint identification by taking the organic light-emitting configuration 150 as a light source of the photosensitive identification device 130. A light ray emitted from the organic light-emitting configuration 150 irradiates the finger of the user through the first surface of the cover plate 320 when the first surface of the cover plate 320 is pressed by the finger of the user. The fingerprint of the finger of the user reflects the light ray to form a reflection light. The reflection light of the fingerprint enters the first surface of the cover plate 320, and irradiates the photosensitive identification device 130 associated with the organic light-emitting configuration 150. Then, the photosensitive identification device 130 receiving the reflection light of the fingerprint generates an inductive signal, and thus, carries out the fingerprint identification. The reason of taking the first light-emitting lattice as a detection light source of the photosensitive identification device 130 is that the light emitted from the organic light-emitting configuration 150 has a large-range angular distribution. Each photosensitive identification device also receives the crosstalk signals of a plurality of other organic light-emitting configurations, in addition to receiving the reflection light of the fingerprint of the associated organic light-emitting configuration, when all the organic light-emitting configurations in the organic light-emitting display panel are adopted to emit light at the same time for the fingerprint identification, causing that the fingerprint identification precision is low.

Figure 17A:
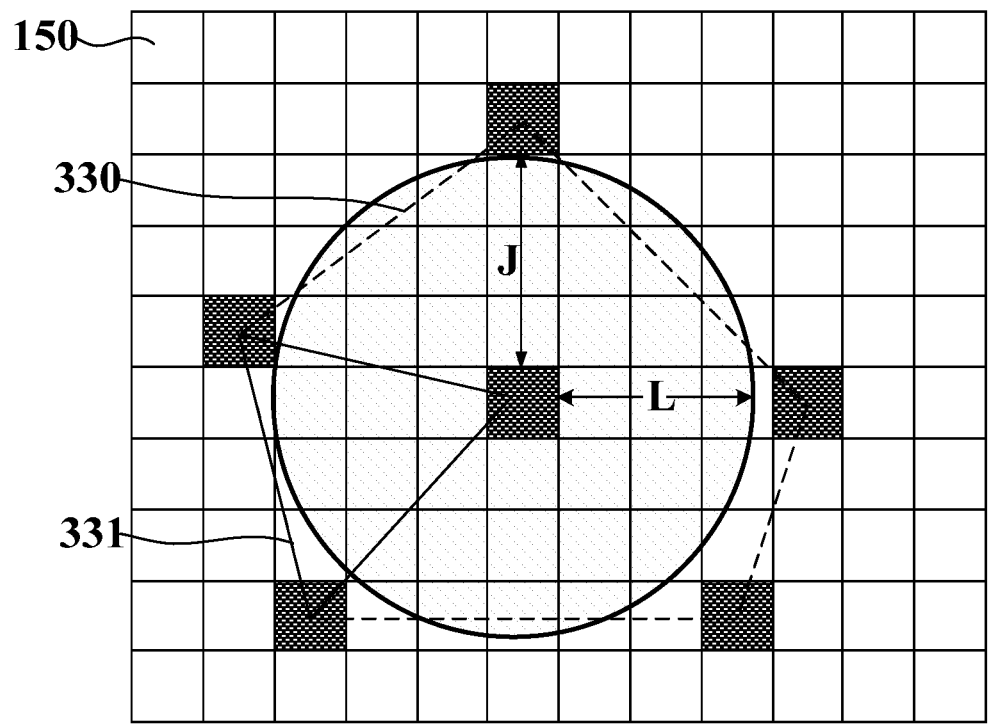
FIG. 17A~FIG. 17C are schematic diagrams illustrating three types of first light-emitting lattice of an organic light-emitting display apparatus according to embodiments of the present disclosure.
Figure 17B:
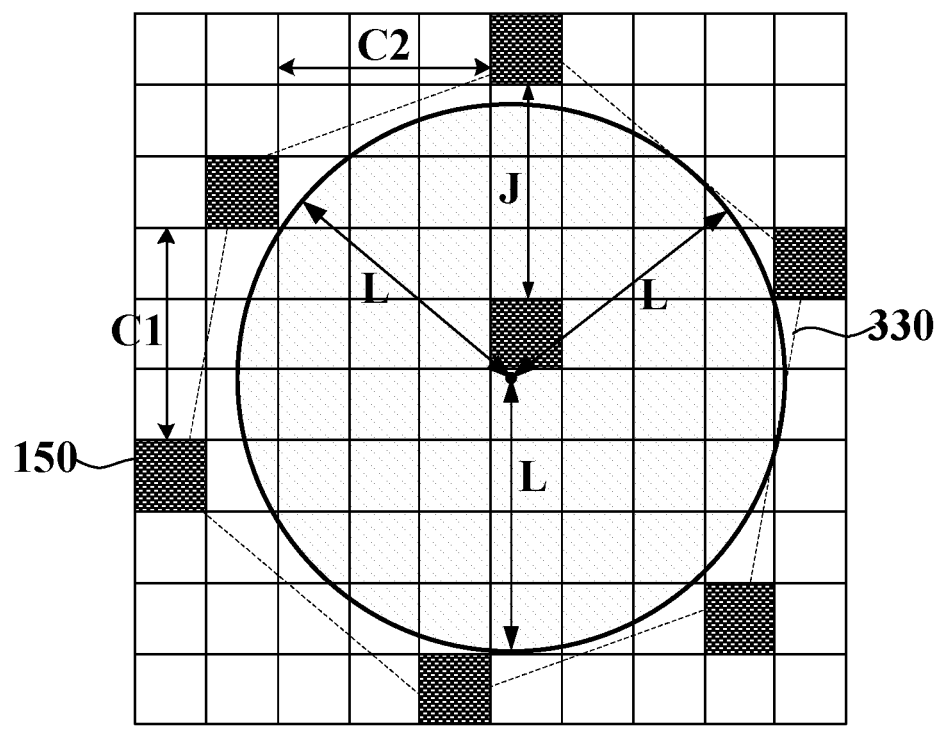
Figure 17C:
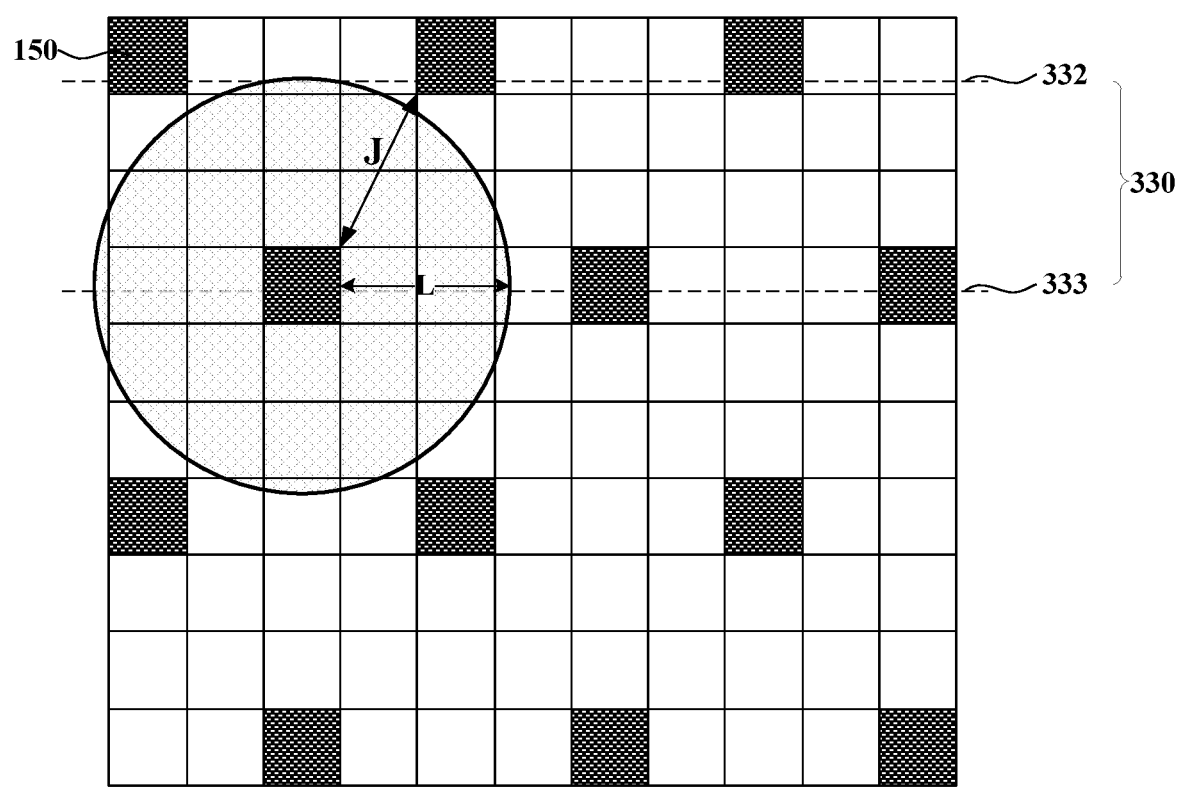

Optionally, FIG. 17A~FIG. 17C are schematic diagrams illustrating three types of the first light-emitting lattice provided by embodiments of the present disclosure.

The first light-emitting lattice 330 shown in FIG. 17A is a pentagonal light-emitting lattice. The pentagonal light-emitting lattice includes a central organic light-emitting configuration 150 and five marginal organic light-emitting configurations 150. The organic light-emitting configurations 150 in the first light-emitting lattice 330 form a plurality of figures. The angles of a FIG. 331 which has a minimum area among the plurality of figures are not equal to 90°. The pentagonal light-emitting lattice can increase the number of the organic light-emitting configurations 150 being illuminated at the same time on the basis of ensuring no signal crosstalk, thereby reducing a time required for reading the fingerprint.

The first light-emitting lattice 330 shown in FIG. 17B is a hexagonal light-emitting lattice. The hexagonal light-emitting lattice includes a central organic light-emitting configuration 150 and six marginal organic light-emitting configurations 150. The hexagonal light-emitting lattice can increase the number of the organic light-emitting configurations 150 being illuminated at the same time on the basis of ensuring no signal crosstalk, thereby reducing the time required for reading the fingerprint.

Referring to FIG. 17C, first light-emitting lattice 330 includes a first light-emitting row 332 and a second light-emitting row 333 arranged alternately. Any organic light-emitting configuration 150 in the first light-emitting row 332 and any organic light-emitting configuration 150 in the second light-emitting row 333 are located in different columns. The first light-emitting lattice 330 can increase the number of the organic light-emitting configurations 150 being illuminated at the same time on the basis of ensuring no signal crosstalk, thereby significantly reducing the time required for reading the fingerprint.

For any first light-emitting lattice 330 provided by any embodiment above, optionally, a distance J between any two adjacent organic light-emitting configurations 150 in the first light-emitting lattice 330 is equal to the minimum crosstalk-free distance L. Apparently, the photosensitive identification device 130 associated with each organic light-emitting configuration 150 in the first light-emitting lattice 330 does not receive a crosstalk signal from other light-emitting configurations which emit light at the same time, thereby guaranteeing the accuracy of a fingerprint signal. Meanwhile, the distance J between any two adjacent organic light-emitting configurations 150 in the first light-emitting lattice 330 is equal to the minimum crosstalk-free distance L, and the number of the organic light-emitting configurations 150 being illuminated at the same time can also be increased, thereby reducing the time required for reading the fingerprint signal, and increasing the fingerprint reading efficiency.

Optionally, in any type of first light emitting lattice 330 provided by any of above embodiments, for any two adjacent organic light emitting configurations 150 located in different rows in the first light emitting lattice 330, a vertical distance C1 (shown in FIG. 17B) from one of the two adjacent organic light emitting configurations 150 to the row in which the other organic light emitting configuration 150 is located is smaller than the minimum crosstalk-free distance L; and/or for any two adjacent organic light emitting configurations 150 located in different columns in the first light emitting lattice 330, a vertical distance C2 (shown in FIG. 17B) from one of the two adjacent organic light emitting configurations 150 to the column in which the other organic light emitting configuration 150 is located is smaller than the minimum crosstalk-free distance L.

To increase the fingerprint identification precision, the plurality of organic light-emitting configurations 150 emit light according to the first light-emitting lattice 330 and shift in the fingerprint identification phase. The distance J between any two adjacent organic light-emitting configurations 150 in the first light-emitting lattice 330 is greater than or equal to the minimum crosstalk-free distance L. The light ray emitted from the organic light-emitting configuration 150 has an angular distribution, so the light ray emitted from the organic light-emitting configuration 150 forms a coverage area on the photosensitive identification array after reflected through the first surface of the cover plate 320. The reflection light of the fingerprint of any angle of light emitted from the organic light-emitting configuration 150 falls in the coverage area, and the maximum radius of the coverage area is the minimum crosstalk-free distance L.

The distance J between any two adjacent organic light-emitting configurations 150 in the first light-emitting lattice 330 in embodiments of the present disclosure is greater than or equal to the minimum crosstalk-free distance L, so the reflection light of the fingerprint of any organic light-emitting configuration 150 not always irradiates the photosensitive identification device 130 associated with other organic light-emitting configurations 150 which emit light at the same time, namely, the photosensitive identification device 130 associated with any organic light-emitting configuration 150 in the first light-emitting lattice 330 only can receive the reflection light of the fingerprint of the organic light-emitting configuration 150 associated therewith. Therefore, the photosensitive identification device 130 does not receive the crosstalk signal of other organic light-emitting configurations, thereby increasing the fingerprint identification precision of the organic light-emitting display apparatus.

It should be noted that, the reflection light of the fingerprint refers to reflection light formed by pressing the fingerprint of the finger of the user on the first surface of the cover plate 320 to reflect the emitted light ray of the organic light-emitting configuration 150, and a distance between the fingerprint of the finger of the user and the first surface of the cover plate 320 is very small relative to the thickness of organic light-emitting display apparatus, and has a relatively small influence on the scope of the coverage area. Therefore, a reflective distance between the finger of the user and the first surface of the cover plate 320 is omitted when the minimum crosstalk-free distance L is set in embodiments of the present disclosure. In addition, a radius L of the coverage area substantially should be calculated by taking a central point of the organic light-emitting configuration 150 as an original point, but the number of the organic light-emitting configurations 150 in the actual organic light-emitting display apparatus is large, and correspondingly the organic light-emitting configuration 150 has a small size. Therefore, the organic light-emitting configurations 150 can be integrally taken as the original point of the coverage area in embodiments of the present disclosure, so the radius L of the coverage area can be expressed as a length from an edge of the organic light-emitting configuration 150 to an edge of the coverage area, and the size of the organic light-emitting configuration 150 may not be included in the minimum crosstalk-free distance L. Those skilled in the art can understand that, the minimum crosstalk-free distance L is related to the thickness of the organic light-emitting display apparatus, a light exit angle of the organic light-emitting configuration and other factors. Therefore, the values of the minimum crosstalk-free distances L of different organic light-emitting display apparatuses are different, and the size of the organic light-emitting configuration can be optionally included in the minimum crosstalk-free distance in other optional embodiments, which is not specifically limited in the present disclosure.

It should be noted that, one organic light-emitting configuration 150 includes three sub-pixels having different colors if the organic light-emitting display panel 310 includes sub-pixels having three colors, which are respectively marked as R, G and B. The reflected signal of the fingerprint basically refers to specular reflection. A reflection angle is equal to an incident angle, and thus it can be known that, $L=\tan \theta *H1+\tan \theta *H2$, where L indicates a minimum crosstalk-free distance, $\theta$ indicates an included angle of a direction corresponding to a preset luminance of the organic light-emitting configuration 150 and a direction vertical to the light-emitting display panel 310, H1 indicates a vertical height from the first surface of the cover plate 320 to the light-emitting functional layer 152, and H2 indicates a vertical height from the first surface of the cover plate 320 to the photosensitive identification array. The preset luminance is less than or equal to 10% of luminance in a direction vertical to the organic light-emitting display panel 310.

An angle of the light ray emitted by the organic light-emitting configuration 150 in embodiments of the present disclosure is related to the luminance of the organic light-emitting configuration 150, and the luminance is a subjective feeling for (decoloration) light-emitting intensity. The luminance of the organic light-emitting configuration 150 in a vertical direction in embodiments of the present disclosure is defined as 100%. The lower the percentage of the luminance is, the larger the corresponding light exit angle (an included angle with a direction vertical to the organic light-emitting layer) is and the larger the corresponding light-emitting intensity is. The light-emitting intensity of the light ray emitted by the organic light-emitting configuration 150 is very weak when the luminance of the organic light-emitting configuration 150 is less than or equal to 10%, and the reflection light formed by the organic light-emitting configuration 150 on the first surface of the cover plate 320 does not cause the crosstalk to the photosensitive identification device 130. Therefore, the light exit angle of the organic light-emitting configuration 150 takes 10% of luminance as a critical value in embodiments of the present disclosure. Based on this, a process of determining $\theta$ is as follows: the luminance of the organic light-emitting configuration 150 in the vertical direction is measured, a position corresponding to 10% of luminance in a direction vertical to the organic light-emitting display panel 310 is determined, and $\theta$ is determined according to the included angle between the direction of the position and the direction vertical to the organic light-emitting display panel 310. Those skilled in the art can understand that, the light-emitting intensity of the organic light-emitting configurations of different organic light-emitting display apparatuses may be different, and the corresponding preset luminance values may also be different. For example, the preset luminance value is optionally 12% or 9% and the like of the luminance in a direction vertical to the organic light-emitting display panel in other optional embodiments, which is not specifically limited in the present disclosure.

Figure 18:
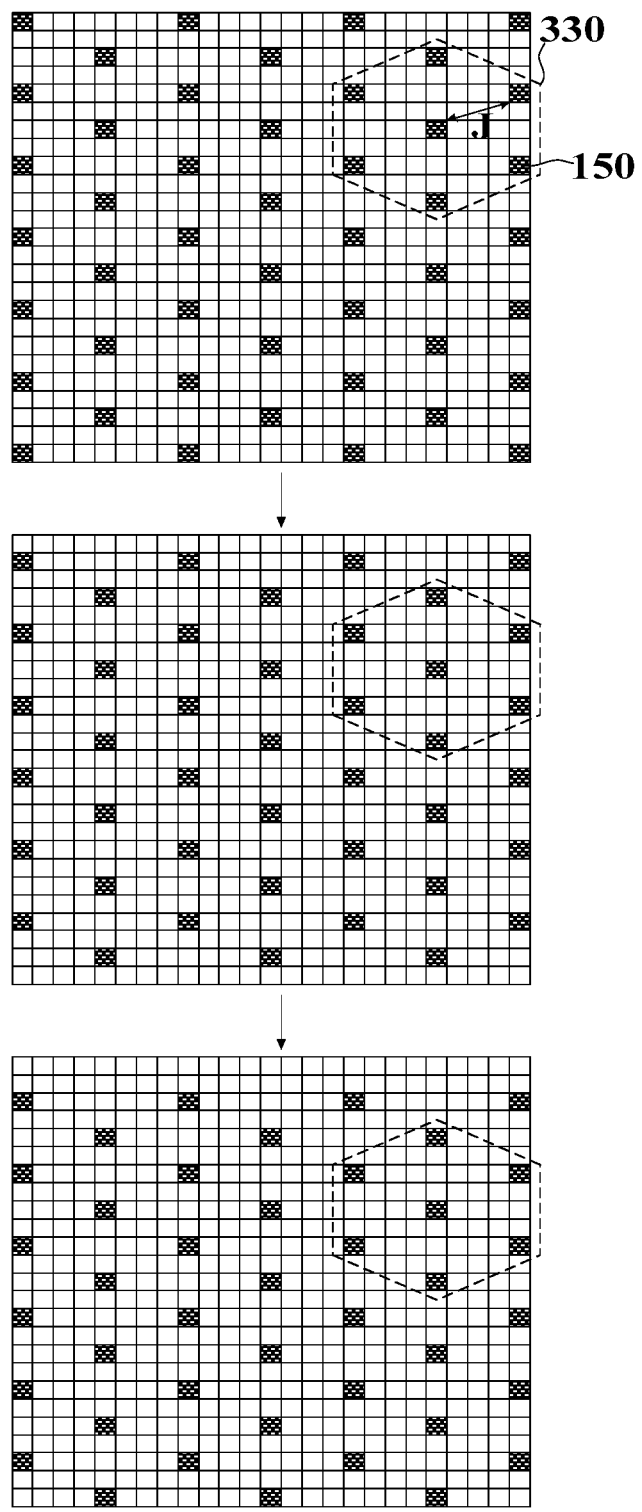
FIG. 18 is a schematic diagram illustrating scanning steps of an organic light-emitting display apparatus according to embodiments of the present disclosure.

FIG. 18 is a schematic diagram illustrating scanning steps of an organic light-emitting display apparatus. In the fingerprint identification phase, the organic light-emitting display apparatus performs the fingerprint identification in the screen scanning mode. Specifically, the organic light-emitting configurations 150 are illuminated at the same time according to the first light-emitting lattice 330, and an inductive signal generated by the photosensitive identification device 130 at a position corresponding to the organic light-emitting configuration 150 being illuminated is recorded. In the next screen, the organic light-emitting configurations 150 being illuminated at the same time shift and the corresponding inductive signals are recorded, until all the organic light-emitting configurations 150 are illuminated circularly; and the fingerprint identification is performed according to the obtained inductive signals of the photosensitive identification devices 130. The fingerprint identification precision is very high since the photosensitive identification devices 130 in embodiments of the present disclosure do not receive the crosstalk signal. Those skilled in the art can understand that, the first light-emitting lattice is optionally a minimum repetitive unit formed by the plurality of organic light-emitting configurations which emit light at the same time, rather than being defined as a lattice formed by the plurality of organic light-emitting configurations which emit light at the same time.

It should be noted that, the organic light-emitting display apparatus in embodiments of the present disclosure reads the fingerprint information with the picture scanning mode. Apparently, if the quantity of the organic light-emitting configurations 150 lightened in a one-frame picture is small, then the larger the number of the picture frames for completing reading the fingerprint information is, the longer the time required for reading the fingerprint information is. To reduce the time required for reading the fingerprint, optionally, the plurality of organic light-emitting configurations 150 of the first light-emitting lattice 330 form a plurality of figures. The angles in the figure which has the minimum area among the plurality of figures is not equal to 90°. The number of the organic light-emitting configurations 150 being illuminated at the same time can be increased on the basis of ensuring no signal crosstalk, thereby significantly reducing the time required for reading the fingerprint.

Embodiments of the present disclosure further provide an electronic device, including any organic light-emitting display panel stated above. The electronic device can be a smart phone, a tablet personal computer and any other organic light-emitting display devices which can be equipped with the organic light-emitting display panel. The electronic device is not specifically limited in the present disclosure.

It should be noted that the above contents are only preferred embodiments of the present disclosure and used technical principles. It can be understood for those skilled in the art that the present disclosure is not limited to specific embodiments described herein. For those skilled in the art, the present disclosure can be subject to various apparent variations, readjustments, combinations and replacements without departing from a protection scope of the present disclosure. Therefore, although the present disclosure is described in detail through above embodiments, the present disclosure is not only limited to above embodiments. The present disclosure can also include more other equivalent embodiments without deviating from conceptions of the present disclosure. A scope of the present disclosure is determined by a scope of attached claims.

What is claimed is:

1. An organic light-emitting display panel, comprising:
    an array substrate; and
    a photosensitive identification array arranged on the array substrate,
    wherein the array substrate comprises a plurality of photosensitive detection circuits, wherein the photosensitive identification array comprises a plurality of photosensitive identification devices, and one of the plurality of photosensitive detection circuits and an associated one of the plurality of photosensitive identification devices are electrically connected;
    wherein the plurality of photosensitive detection circuits each comprises a common voltage input layer and a photosensitive detection switch having a drain metal layer;
    wherein the plurality of photosensitive identification devices each comprises a first pole and a second pole, wherein the first pole is electrically connected with the drain metal layer of an associated photosensitive detection circuit, and the second pole is electrically connected with the common voltage input layer of the associated photosensitive detection circuit;
    wherein the common voltage input layer of each of the photosensitive detection circuits is arranged in one of the following manners: the common voltage input layer of said photosensitive detection circuit and the first pole of the associated photosensitive identification device are overlapped with each other in a direction perpendicular to the array substrate to form a photosensitive storage capacitor; and
    wherein the common voltage input layer and the drain metal layer in each of the photosensitive detection circuits are overlapped with each other in the direction perpendicular to the array substrate to form the photosensitive storage capacitor.

2. The organic light-emitting display panel according to claim 1, wherein the drain metal layer of the photosensitive detection switch is multiplexed as the first pole of the photosensitive identification device.

3. The organic light-emitting display panel according to claim 1, further comprising a plurality of organic light-emitting configurations arranged on the array substrate, wherein each of the organic light-emitting configurations comprises a first electrode, a light-emitting functional layer and a second electrode in a direction far away from the array substrate successively.

4. The organic light-emitting display panel according to claim 3, wherein the common voltage input layer of each of the photosensitive detection circuits and the first electrode of each of the organic light-emitting configurations are in a same layer.

5. The organic light-emitting display panel according to claim 3, wherein the first pole of each of the photosensitive identification devices and the first electrode of each of the organic light-emitting configurations are in a same layer.

6. The organic light-emitting display panel according to claim 3, wherein the second pole of each of the photosensitive identification devices comprises a first connection metal and a second connection metal, and wherein the first connection metal is electrically connected with the second connection metal and the common voltage input layer of the associated photosensitive detection circuit respectively.

7. The organic light-emitting display panel according to claim 6, wherein the first connection metal and the first electrode of each of the organic light-emitting configurations are in a same layer.

8. The organic light-emitting display panel according to claim 1, wherein the photosensitive detection switch further comprises a first gate.

9. The organic light-emitting display panel according to claim 8, wherein the common voltage input layer of each of the photosensitive detection circuits and the first gate of the photosensitive detection switch are in a same layer.

10. The organic light-emitting display panel according to claim 8, wherein the common voltage input layer of each of the photosensitive detection circuits is arranged between a film in which the first gate of the photosensitive detection switch is located and a film in which the drain metal layer of the photosensitive detection switch is located.

11. The organic light-emitting display panel according to claim 10, wherein the array substrate further comprises a pixel storage capacitor, wherein a first pole of the pixel storage capacitor and the first gate of the photosensitive detection switch are in a same layer, and wherein a second pole of the pixel storage capacitor and the common voltage input layer are in a same layer.

12. The organic light-emitting display panel according to claim 8, wherein the drain metal layer of the photosensitive detection switch comprises a first drain and a compensation drain layer electrically connected with the first drain but disposed in a different layer, and wherein the first pole of each of the photosensitive identification devices is electrically connected with the first drain of the associated photosensitive detection circuit; and
    wherein in each of the photosensitive detection circuits, the common voltage input layer is arranged between a film in which the first drain is located and the compensation drain layer, and wherein the common voltage input layer is overlapped with the first drain and the compensation drain layer in a direction perpendicular to the array substrate respectively.

13. The organic light-emitting display panel according to claim 12, wherein the compensation drain layer and the first gate of the photosensitive detection switch are in a same layer.

14. The organic light-emitting display panel according to claim 1, wherein each of the photosensitive identification devices further comprises a PN junction having a photosensitive characteristic, wherein the PN junction comprises a P-doped semiconductor layer, an amorphous silicon layer and an N-doped semiconductor layer stacked successively, wherein the P-doped semiconductor layer is electrically connected with the common voltage input layer of the corresponding one of the photosensitive detection circuits, and the N-doped semiconductor layer is electrically connected with the drain metal layer of the corresponding one of the photosensitive detection circuits.

15. The organic light-emitting display panel according to claim 1, wherein each of the photosensitive identification devices further comprises a PN junction having a photosensitive characteristic, the PN junction comprises a P-doped semiconductor layer, an amorphous silicon layer and an N-doped semiconductor layer stacked successively, wherein the P-doped semiconductor layer is electrically connected with the drain metal layer of the corresponding one of the photosensitive detection circuits, and the N-doped semiconductor layer is electrically connected with the common voltage input layer of the corresponding one of the photosensitive detection circuits.

16. The organic light-emitting display panel according to claim 1, further comprising a plurality of organic light-emitting configurations of a first color arranged on the array substrate, wherein one of the plurality of organic light-emitting configurations of the first color is arranged to be associated with one of the plurality of photosensitive identification devices, and each of the photosensitive identification devices is arranged in a non-display region of the associated organic light-emitting configuration of the first color.

17. The organic light-emitting display panel according to claim 16, wherein the organic light-emitting configuration of the first color is at least one of a red organic light-emitting configuration and a green organic light-emitting configuration.

18. An electronic device comprising an organic light-emitting display panel, wherein organic light-emitting display panel comprises:
    an array substrate; and
    a photosensitive identification array arranged on the array substrate,
    wherein the array substrate comprises a plurality of photosensitive detection circuits, wherein the photosensitive identification array comprises a plurality of photosensitive identification devices, and one of the plurality of photosensitive detection circuits and an associated one of the plurality of photosensitive identification devices are electrically connected;
    wherein the plurality of photosensitive detection circuits each comprise a common voltage input layer and a photosensitive detection switch having a drain metal layer;
    wherein of the plurality of photosensitive identification devices each comprise a first pole and a second pole, wherein the first pole is electrically connected with the drain metal layer of an associated photosensitive detection circuit, and the second pole is electrically connected with the common voltage input layer of the associated photosensitive detection circuit,
    wherein the common voltage input layer of each of the photosensitive detection circuits is arranged in one of the following manners: the common voltage input layer of said photosensitive detection circuit and the first pole of the associated photosensitive identification device are overlapped with each other in a direction perpendicular to the array substrate to form a photosensitive storage capacitor; and the common voltage input layer and the drain metal layer in each of the photosensitive detection circuits are overlapped with each other in the direction perpendicular to the array substrate to form the photosensitive storage capacitor.

19. A manufacturing method of an organic light-emitting display panel, comprising:
    providing an array substrate, wherein the array substrate comprises a plurality of photosensitive detection circuits, wherein the plurality of photosensitive detection circuits each comprise a common voltage input layer and a photosensitive detection switch, and the photosensitive detection switch comprises a drain metal layer; and
    forming a photosensitive identification array on the array substrate, wherein the photosensitive identification array comprises a plurality of photosensitive identification devices, wherein one of the plurality of photosensitive detection circuits and an associated one of the plurality of photosensitive identification devices are electrically connected, the plurality of photosensitive identification devices each comprise a first pole and a second pole, wherein the first pole is electrically connected with the drain metal layer of an associated photosensitive detection circuit, and wherein the second pole is electrically connected with the common voltage input layer of the associated photosensitive detection circuit
    wherein the common voltage input layer of each of the photosensitive detection circuits is arranged in one of the following manners: the common voltage input layer of each of the plurality of photosensitive detection circuits and the first pole of the associated photosensitive identification device are overlapped with each other in a direction perpendicular to the array substrate to form a photosensitive storage capacitor; and the common voltage input layer and the drain metal layer in each of the photosensitive detection circuits are overlapped with each other in the direction perpendicular to the array substrate to form the photosensitive storage capacitor.

* * * * *